United States Patent [19]

Sanders et al.

[11] Patent Number: 6,118,803
[45] Date of Patent: Sep. 12, 2000

[54] OPTICALLY AMPLIFYING SEMICONDUCTOR DIODES WITH CURVED WAVEGUIDES FOR EXTERNAL CAVITIES

[75] Inventors: Steve Sanders, Palo Alto; Mats Hagberg, Santa Clara; Robert J. Lang, Pleasanton, all of Calif.

[73] Assignee: SDL, Inc., San Jose, Calif.

[21] Appl. No.: 09/351,480

[22] Filed: Jul. 13, 1999

Related U.S. Application Data

[62] Division of application No. 08/975,559, Nov. 21, 1997.

[51] Int. Cl.[7] .................................................. H01S 3/085
[52] U.S. Cl. ................................................. 372/50; 372/45
[58] Field of Search ................................... 372/45, 46, 50

[56] References Cited

U.S. PATENT DOCUMENTS

| | | | |
|---|---|---|---|
| 4,378,255 | 3/1983 | Holonyak, Jr. et al. | 438/36 |
| 4,511,408 | 4/1985 | Holonyak, Jr. | 438/36 |
| 4,727,556 | 2/1988 | Burnham et al. | 372/50 |
| 4,799,229 | 1/1989 | Miyazawa et al. | 372/50 |
| 4,856,014 | 8/1989 | Figueroa et al. | 372/46 |
| 4,872,180 | 10/1989 | Rideout et al. | 372/99 |
| 4,901,123 | 2/1990 | Noguchi et al. | 372/98 |
| 4,942,585 | 7/1990 | Ungar | 372/44 |
| 4,965,525 | 10/1990 | Zah | 359/341 |
| 5,008,889 | 4/1991 | Wilson | 372/32 |
| 5,223,722 | 6/1993 | Nagai et al. | 257/96 |
| 5,396,511 | 3/1995 | Nakatsuka et al. | 372/43 |
| 5,400,353 | 3/1995 | Walpole et al. | 372/46 |
| 5,400,356 | 3/1995 | Bringans et al. | 372/46 |
| 5,403,775 | 4/1995 | Holonyak, Jr. et al. | 438/38 |
| 5,465,266 | 11/1995 | Bour et al. | 372/46 |
| 5,537,432 | 7/1996 | Mehuys et al. | 372/50 |
| 5,555,544 | 9/1996 | Walpole et al. | 372/50 |
| 5,574,304 | 11/1996 | Mushiage et al. | 372/50 |
| 5,592,503 | 1/1997 | Welch et al. | 372/50 |
| 5,602,864 | 2/1997 | Welch et al. | 372/50 |
| 5,771,252 | 6/1998 | Lang et al. | 372/20 |
| 5,870,417 | 2/1999 | Verdiell et al. | 372/20 |

FOREIGN PATENT DOCUMENTS

| | | |
|---|---|---|
| 195 00 135 A1 | 7/1996 | Germany . |
| 195 00 136 A1 | 7/1996 | Germany . |
| 1-108788 | 4/1989 | Japan . |
| 3-91278 | 4/1991 | Japan . |
| 4-237031 | 8/1992 | Japan . |
| 8-184720 | 7/1996 | Japan . |

OTHER PUBLICATIONS

Ogura, M. et al., "Surface emitting laser diode with bent waveguide", *Appl. Phys. Lett.*, 50(12):705–707 (Mar. 23, 1987).

Tanbun–Ek, T. et al., "Tunable Electroabsorption Modulated Laser Integrated with Bent Waveguide Distributed–Feedback Laser", *IEEE Integrated Technology Letters*, 9(5):563–565 (May 1997).

Yuan, Y. et al., "Monolithic Integration of Curved Waveguides and Channeled–Substrate DH Lasers by Wet Chemical Etching", *Journal of Lightwave Technology*, LT–1(4) 630–637 (Dec. 1983).

*Primary Examiner*—James W. Davie
*Attorney, Agent, or Firm*—Altera Law Group LLC

[57] ABSTRACT

A semiconductor gain element has an active waveguide incident at an angle greater than normal incidence on an end facet. The waveguide may be a single stripe or may be a stripe coupled to a flared region. The waveguide may include a curved portion to produce the non-normal incidence on the end facet. The gain element may be used as the gain element within a tunable, external cavity laser, or may also be used as an amplifier to amplify an external signal. The waveguide may be formed from a central portion surrounded laterally by cladding regions. Further, absorbing regions may be positioned outside the cladding regions to absorb light that does not propagate within the waveguide.

9 Claims, 11 Drawing Sheets

FIG._8 FAR FIELD ANGLE

OPTICALLY AMPLIFYING SEMICONDUCTOR DIODES WITH CURVED WAVEGUIDES FOR EXTERNAL CAVITIES

This application is a division of Ser. No. 08/975,559 filed Nov. 21, 1997.

BACKGROUND

Generally, the present invention relates to optical gain elements based on semiconductor laser diodes, and particularly to laser diode gain elements having curved waveguides.

Optical semiconductor devices produce large reflections due to the high refractive index of the semiconductor material. Anti-reflection coatings are typically employed to reduce the amplitude of the reflections, preferably to a level of less than 0.1%. However, an anti-reflection coating for a semiconductor device is a relatively complex coating due to the semiconductor's high refractive index. Consequently, the reflectivity of an anti-reflection coating is generally low only over a small range of wavelengths, with the reflectivity increasing for wavelengths outside this small range.

Problems may arise, for example, where a semiconductor gain element is employed in a tunable, external cavity laser, where anti-reflection coatings are typically required on intracavity surfaces, including any intracavity face of the gain element. The tuning range over which the laser can operate is limited because the anti-reflection coatings on the gain element are effective only over a narrow range of wavelengths. Operation of the laser outside the wavelength range where the gain element's anti-reflection coating is most effective may result in spurious reflections compromising the quality of the output signal from the laser. Furthermore, the operating power of the semiconductor gain element is limited, since the higher reflectivity for wavelengths outside the range of the anti-reflection coating may result in uncontrolled, untunable oscillation at those wavelengths, or may result in some other degradation of the quality of the output from the laser.

Therefore, there is a need to increase the tuning range over which external cavity semiconductor lasers may be tuned, and also a need to permit external cavity, tunable lasers to operate at high power without compromising the quality of the laser output.

SUMMARY OF THE INVENTION

According to one embodiment of the invention, a semiconductor gain element is formed from a semiconductor layered structure having first and second end faces. A waveguide on the structure has a first end adjacent to and directed towards the first end of the structure at an angle, θ. The waveguide includes a curved portion near the first end, and also has a flared light amplifying region coupled to the waveguide that flares towards the second end face. The semiconductor gain element may be employed as the gain element for a tunable, external cavity laser, and may also be used as an amplifier to amplify an optical signal.

According to another embodiment of the invention, a semiconductor optical gain element includes a semiconductor layered structure having first and second end faces and an active stripe waveguide including first and second ends. The first end of the waveguide is adjacent to and directed towards the first end face, and the second end is adjacent to and directed towards the second end face at an angle, θ, greater than normal incidence. The waveguide curves continuously between its first and second ends. The semiconductor gain element may be employed as the gain element for a tunable, external cavity laser, and may also be used as an amplifier to amplify an optical signal.

Another embodiment of the invention includes a laser having a Littman-Metcalf cavity, and a semiconductor optical gain element that has a semiconductor layered structure having first and second end faces and an active stripe waveguide. The waveguide has a first end adjacent to and directed towards the first end face at an angle, θ, greater than normal incidence.

Another embodiment of the invention is a semiconductor gain element having a waveguide with a single-mode filter portion extending along a semiconductor layered structure from a first end face and having a waveguide refractive index. Cladding regions are laterally disposed around the filter portion, each cladding region having a cladding refractive index lower than the waveguide index, so as to optically confine light within the waveguide. Absorbing regions are laterally positioned on opposite sides of the cladding regions from the single-mode filter portion to absorb light Another embodiment of the invention is a laser having a master oscillator providing an output and a semiconductor gain element having a waveguide terminating at a first end facet of the element at an incident angle, θ, sufficiently large to prevent light in the gain element from internally reflecting from the first end face and propagating back into the waveguide, the waveguide coupled to receive the oscillator output.

Another embodiment of the invention is a method of operating a laser, including reflecting light within an optical cavity, amplifying light propagating within the cavity and guiding light propagating within the optical cavity along a means for guiding curved continuously between ends. The guiding means are arranged to propagate light through an aperture at an angle greater than normal incidence. The method further includes selecting an oscillating frequency of the laser.

Another method according to the present invention is a method of operating a laser by reflecting light within an optical cavity, guiding light propagating within the optical cavity along a guiding means having a curved portion arranged to propagate light through an aperture of the guiding means at an angle greater than normal incidence and amplifying the light propagating within the optical cavity in a flared light amplifying region coupled at a narrow end of a flared section to the guiding means. The method also includes selecting an operating frequency of the laser.

The above summary of the present invention is not intended to describe each illustrated embodiment or every implementation of the present invention. Other objects and attainments, together with a fuller understanding of the invention will become apparent and appreciated by referring to the following description and claims taken in conjunction with the accompanying drawings.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to laser diode gain elements. The invention is believed to be particularly suited for laser diode gain elements that are used in external cavity semiconductor lasers, where the light propagating within the optical cavity passes through a facet end of the semiconductor chip. The high refractive index of semiconductor materials produces large reflections at this interface. Past approaches to reducing the reflection from this face have mainly been directed to the application of anti-reflection coatings. However, the anti-reflection coatings are required to be fabricated with high tolerances because laser diodes have high optical gain, and even small reflections can cause parasitic oscillation.

In one approach of the present invention, the light propagates within the semiconductor gain element in a curved waveguide that forms an angle with the end face of the substrate, or layered structure, that is greater than normal incidence. The non-normal incidence on the face reduces the amplitude of the signal reflected along the cavity axis, thus improving the performance of the gain element in a tunable, external cavity laser.

Among the advantages of this approach are that the reflectivity of the facet end is maintained to be low (typically, less than 0.1%) over a wide spectrum of the gain element. In contrast, when an anti-reflection coating is used at the face of a gain element having normal incidence, the reflectivity is below 0.1% for only a small fraction of the gain spectrum because of the complex nature of the coating. Consequently, when the gain element of the present invention is used in a tunable, external cavity laser, the laser has a broader range of tunability and better suppression of undesired lasing frequencies than when an anti-reflection coating alone is relied on for reducing the reflectivity.

An anti-reflection coating may still be employed on the end surface where a curved waveguide is used, but the tolerances on the anti-reflection coating are relaxed because reflections within the optical system are at non-normal incidence. Thus, the anti-reflection coating may have a broader effective wavelength range.

Further, the curved waveguide suppresses lasing between end facets more effectively than anti-reflection coatings alone, even at high current levels. This results in the gain element having a broader gain spectrum because higher energy states may be populated at the higher current levels.

Consequently, the use of laser diode gain elements having curved waveguides enables broader tunability, higher output powers, and higher manufacturing yields from external cavity laser diodes, while still maintaining single frequency oscillation.

Figure 1A:
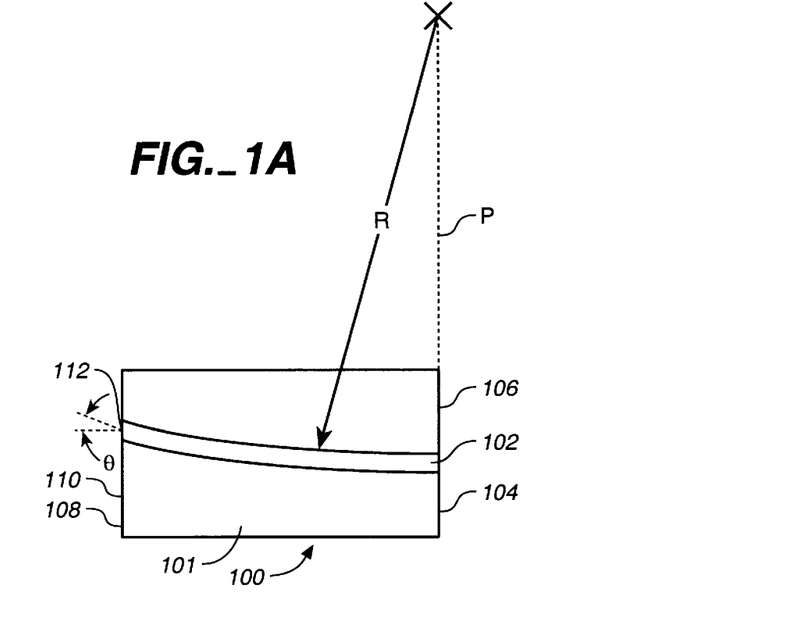
FIGS. 1A and 1B illustrate a semiconductor gain elements with a curved active stripe waveguide according to embodiments of the present invention.

One particular embodiment of a laser diode gain element with a curved waveguide is illustrated in FIG. 1A. The gain element 100 is formed from a layered structure 101 on which an active stripe waveguide 102 extends between a first end face 104 and a second end face 108. The waveguide 102 is normally incident on the first face 104. The first face 104 may be provided with an optical coating 106 to facilitate a desired operation. For example, if the gain element 100 is employed in an external cavity laser and the first face 104 is situated at an end of the cavity, the optical coating 106 may be a highly reflective coating. Under different conditions, it may be desired to extract light through the first face 104 and so the optical coating 106 may be a coating with a reduced reflectivity, or may also be an anti-reflection coating. The waveguide 102 curves continuously from the first face 104 to the second face 108. In this particular embodiment, the waveguide 102 meets the first face 104 at normal incidence. Thus, the center of curvature, X, lies on a plane P defined by the first face 104 which plane projects vertically out of the plane of the figure. The waveguide 102 forms an angle θ relative to a normal to the second face 108. The angle θ may be referred to as the incident angle. Thus, where the waveguide forms a right angle with the end face, the incident angle θ=0°. The second face 108 may be provided with an optical coating 110. The optical coating 110 may be, for example, an anti-reflection coating.

The direction of the output end 112 of the waveguide 102 defines the angle θ, with the second face 108. The angle θ may lie in the range from 1° to 15°. Reflective losses at the second face 108 increase where the θ is larger than 15°. A range for θ of 3° to 7° may be used. When the waveguide 102 is curved continuously from the first face 104 to the second face 108, the radius of curvature in the bend on the waveguide 102 is at a maximum for a given waveguide length and angle θ, thus reducing bending losses in the curved waveguide 102. Since a smaller radius of curvature results in higher losses, the present embodiment permits losses to be reduced. Other design configurations may include a straight region of waveguide. However, in those configurations, preferably a large portion of the stripe is curved as taught in this application.

Figure 1B:
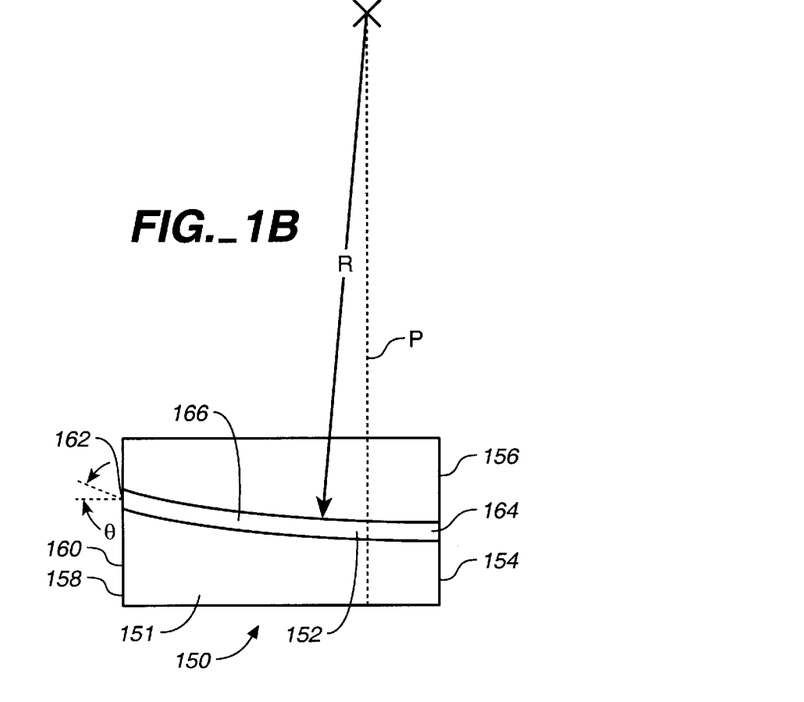

Another embodiment of a gain element 150 is illustrated in FIG. 1B. The gain element 150 is formed from a layered structure 151 on which an active stripe waveguide 152 extends between a first end face 154 and a second end face 158. The waveguide 152 is normally incident on the first face 154. The first face 154 may be provided with an optical coating 156 to facilitate a desired operation. As discussed above, the optical coating 156 may be a highly reflective coating, or a coating having a reduced reflectivity, including an anti-reflection coating. The waveguide 152 may have a straight portion 164 that extends from the first end face and connects to a curved portion 166. As a result of the curve of the curved portion, 166, the waveguide 152 forms angle, θ, with the second end face 154. In this embodiment, the center of curvature, X, lies on a plane P defined by the region where the curved portion 166 and straight portion 164 are connected. Where the curved portion 166 does not extend all the way to the second end face 154, the waveguide 152 may have a terminating angled straight portion (not illustrated).

Figure 2:
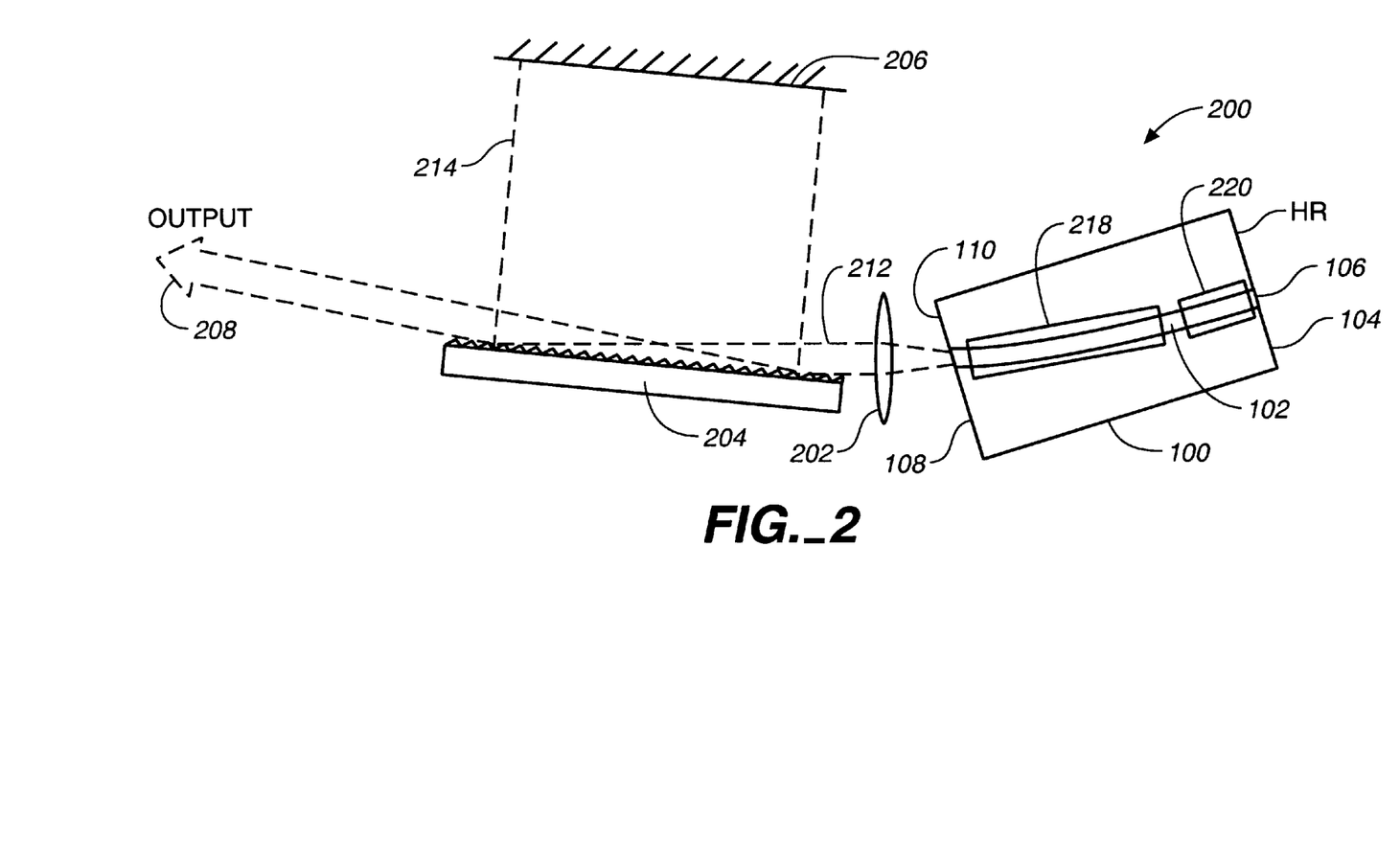
FIG. 2 illustrates an embodiment of a tunable, external cavity laser incorporating the gain element of FIG. 1A.

FIG. 2 illustrates the use of the gain element 100 of FIG. 1A in one embodiment of a tunable, external cavity laser. One face of the laser 200 is formed by an HR coating 106 on the first face 104. The laser also includes collimating optics 202, illustrated as a lens, a diffraction grating 204 and a retroreflector 206. The collimating optics 202 may include one or more lenses to collimate the diverging light output from the waveguide 102. The collimated beam 212 is incident on the diffraction grating 204 at grazing incidence. A diffracted beam 214 from the diffraction grating 204 is incident on the retroreflector 206 which, together with the high reflective coating 106 forms the optical cavity of the laser 200. The diffracted beam 214 is retroreflected on to the diffraction grating 204, which then redirects at least a portion of the diffracted beam 214 back into the collimated beam 212 for transmission back into the waveguide 102. The laser output 208 is the zero-order diffraction taken from the diffraction grating 204.

The gain element 100 may be used in several different embodiments of externally tuned cavities, such as the Littman-Metcalf configuration discussed in U.S. patent application Ser. No. 08/592,906, and titled External Cavity, Continuously Tunable Wavelength Source, filed by Robert J. Lang, David G. Mehuys, and David Welch on Jan. 29, 1996, U.S. Pat. No. 5,771,252, which is incorporated herein by reference. The gain element 100 may be employed in the external cavity configurations disclosed in U.S. Pat. No. 5,537,432, also incorporated herein by reference.

The gain element is particularly advantageous when used in a laser cavity configured to provide single mode operation with continuous tuning. Operation of a gain element having a waveguide at non-normal incidence on the end face reduces parasitic effects arising from on-axis reflection. Anti-reflection coatings may also be used to reduce the amount of light reflected at the end face of the gain element. Thus, the tuning range of the device may be increased because it is no longer constrained by the narrow bandwidth of the low reflectivity coatings required for normal incidence operation. For example, a Littman-Metcalf cavity has operated on a single longitudinal mode over a tuning range of approximately 741 nm–797 nm (56 nm) where the gain element was an AlGaAs-based element having a curved stripe. In contrast, the same laser cavity operating with a conventional, linear stripe gain element was only able to tune over approximately 15 nm–20 nm. Thus, the introduction of the curved active strip resulted in an increase in tuning range of almost a factor of four.

Additionally, the gain element may be operated at higher power levels, since parasitic processes within the laser cavity are suppressed when the waveguide forms an angle greater than normal incidence with the end face of the gain element. This may result in a further increase in the range of tunability of the laser, and an increased power output while maintaining single mode operation.

Figure 13:
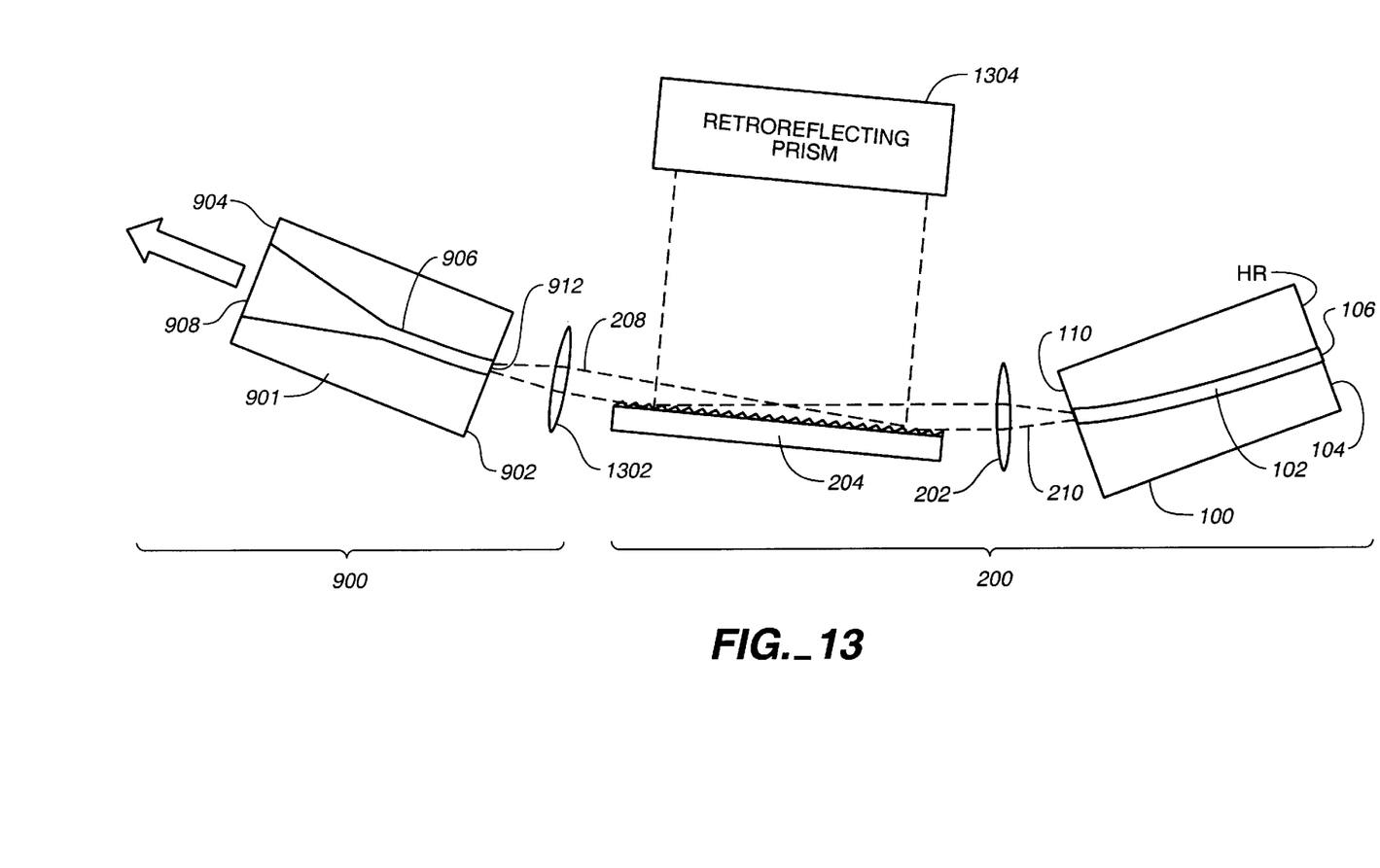
FIG. 13 illustrates another embodiment of an oscillator/amplifier combination.

The retroreflector 206 may be a mirror, as illustrated, or a retro-reflecting prism, as illustrated in FIG. 13. The retroreflector 206 is rotated, or pivoted, about a point to tune the laser. In the Littman-Metcalf cavity, the retroreflector is pivoted about a point selected so that the length of the cavity increases in synchronism with the frequency selected by the grating 204 so that the single mode of the cavity tunes continuously, without mode-hopping. Where the retroreflector 206 is a retroreflecting prism, the prism is oriented so that image inversion takes place in the non-dispersive plane, i.e. the prism is rotatable or pivotable so as to tune the laser. The use of a retroreflecting prism advantageously reduces cavity misalignment and improves stability of the laser output 208.

Figure 14:
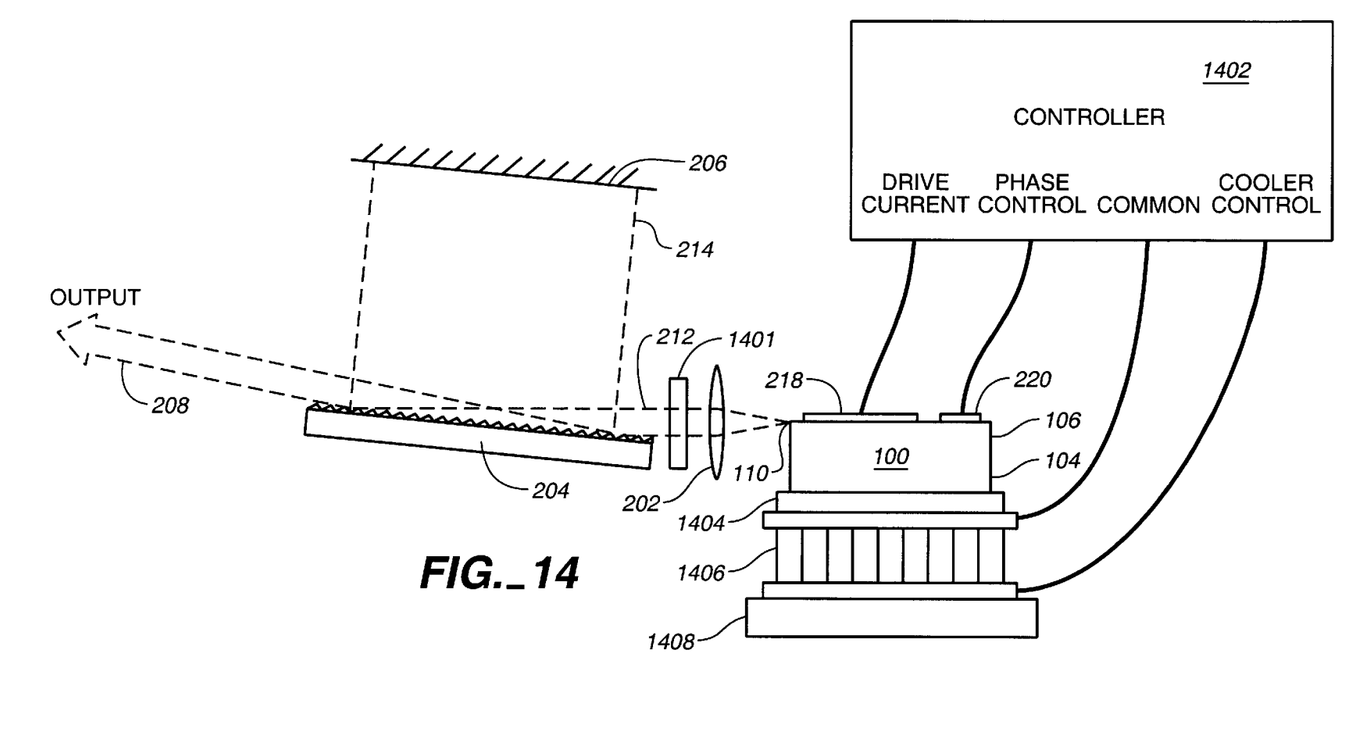
FIG. 14 illustrates another embodiment of a tunable external cavity laser.

FIG. 14 illustrates another embodiment of the laser 200. Here, the grating 204 is oriented so as to lie almost in the same plane as the junction of the gain element 100, whereas in the embodiment of FIG. 2 the grating 204 lies substantially perpendicular to the plane of the junction in the gain element 100. A half-wave plate 1401 may be positioned within the cavity to select the polarization of light incident on the grating 204. FIG. 14 also illustrates that the gain element 100 is coupled to a controller 1402. The controller 1402 supplies current to the gain element 100 to drive the active stripe waveguide 102, and may also control the reverse-bias voltage applied to the phase modulation electrode 220.

The layered structure 101 is mounted on a heat spreader 1404, which may be formed from copper. The heat spreader 1404 is mounted on a thermoelectric cooler 1406 (TEC), which is driven by a current supplied by the controller 1402. The TEC may also be mounted on a heatsink 1408. The TEC 1406 and heatsink 1408 are used to remove heat from the gain element 100 and to maintain the gain element 100 at a preselected operating temperature, so as to stabilize operation of the laser 200. It will be appreciated that other approaches to heat removal and temperature stabilization may be employed.

The laser 200 may also be tuned electrically. For example, an increase in the current passing through the diode of the active stripe waveguide 102 results in a change in the refractive index of the waveguide, thus altering the effective cavity length and tuning the laser mode. In another embodiment, the gain element 100 is provided with two electrodes, a first electrode 218 to provide current through the active stripe in the conventional manner. A phase modulating electrode 220 may also be provided over the active stripe 102 to permit the application of a modulating voltage to the diode junction that forms the active region in the gain element 100. The voltage modulates the refractive index of the stripe 102, thus tuning the laser mode.

Figure 3:
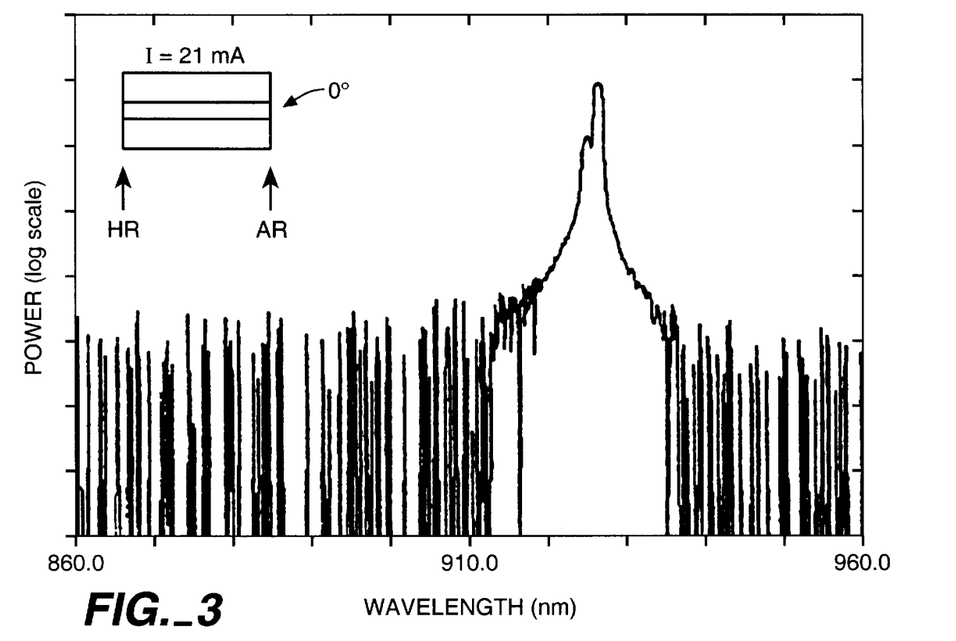
FIGS. 3 and 4 illustrate spontaneous emission spectra produced by gain elements having straight and curved active stripes respectively.
Figure 4:
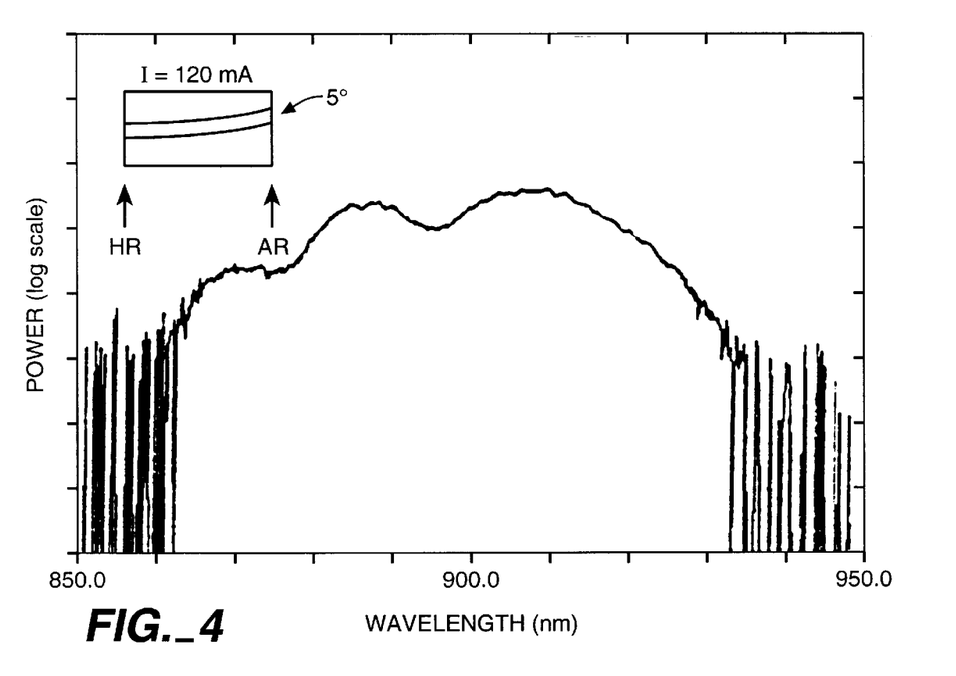

FIGS. 3 and 4 illustrate an advantage of the presently claimed invention. Each figure shows power plotted against wavelength for semiconductor gain elements having a high reflective coating on one face and an anti-reflection coating on the other face. In both cases the active stripe has an indium gallium arsenide active region. In FIG. 3, the active stripe of the gain element is normally incident on the AR coated face. The spectrum shows significant narrowing of the spectrum, even though the current through the device was 21 mA. In contrast, a gain element having the same length and similar HR and AR coatings shows a much broader emission spectrum at an injection current of approximately 6 times higher when the active stripe is curved and is incident on the AR coated face at an angle of 5°. Therefore, the gain element with the curved active stripe may be operated at a higher power level and over a broader spectral region as compared with the straight waveguide device without self-oscillation occurring.

Figure 5A:
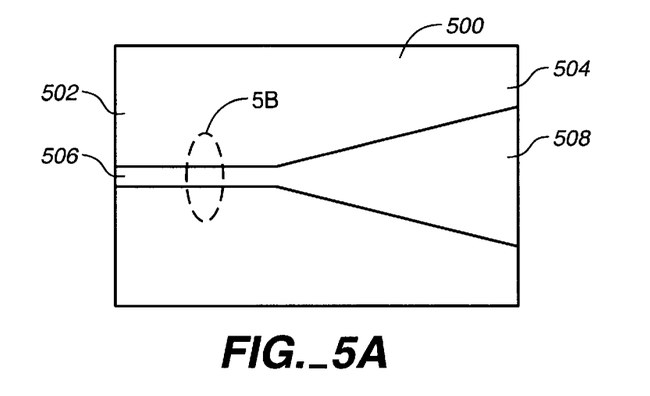
FIGS. 5A and 5B illustrate a gain element with a flared light amplifying region according to another embodiment of the invention.

Another embodiment of the invention is illustrated in FIG. 5A, in which a semiconductor gain element 500 has a first face 502 and a second face 504. A waveguide 506 is disposed between the first face 502 and a flared amplifier section 508. The waveguide 506 is optically coupled to the flared light amplifying region 508. Light propagating from the waveguide 506, where there is lateral optical confinement, diffracts on passing into the flared light amplifying region 508. The flare angle of the flared light amplifying region 508 is approximately equal to the diffraction angle of the light propagating into the flared amplifier section 508 from the waveguide 506. It will be appreciated that the waveguide 506 and the flared amplifier section 508 both provide vertical confinement for the light, whereas only the waveguide 506 provides lateral confinement for the light. In one particular embodiment, the waveguide 506 is a single mode, index-guided waveguide and acts as a single mode waveguide for light having a wavelengths within the gain spectrum of the flared light amplifying region 508. Therefore, the light coupled from the single mode waveguide 506 into the flared light amplifying region 508 diffracts from a single mode and is diffraction limited.

Figure 5B:
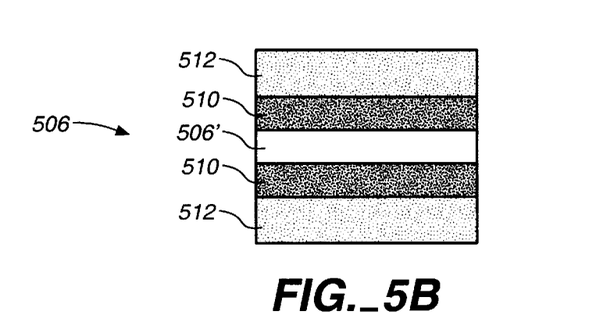

The single mode waveguide 506 may be formed having cladding regions 510 positioned laterally on either side of a central portion 506', as illustrated in the magnified view of FIG. 5B. The cladding regions 510 provide lateral confinement because they have a lower refractive index than the central portion 506'. It will be appreciated that the central portion 506' and the cladding regions 510 may be formed by various methods including, but not limited to, the formation of a ridge waveguide, the formation of a buried rib waveguide, selective area growth, etch-and regrowth, laser-assisted disordering, impurity-induced disordering, vacancy-induced disordering, growth over a pattern substrate, introduction of stress and the introduction of thermal gradients across the device. Numerous other variations in the means for forming the waveguides and cladding regions will be apparent to those skilled in the art. Furthermore, cladding regions may be formed from reverse-biased regions. The gain element 500 may also be provided with absorbing regions 512.

Figure 5C:
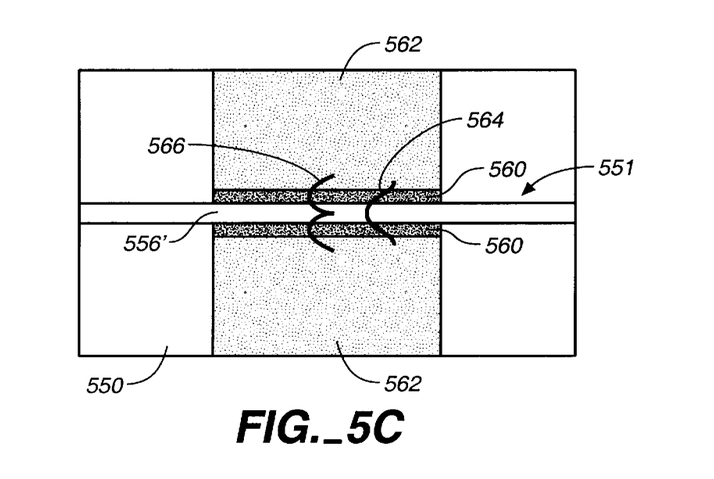
FIG. 5C illustrates single-mode filtering by the waveguide of FIG. 5B.

The embodiment of FIG. 5B has advantages in enhancing single-mode operation, as illustrated with reference to FIG. 5C. The waveguide structure 551 has a central waveguide portion 556' with cladding regions 560 positioned laterally on either side. Absorbing regions 562 are positioned on opposite sides of the cladding regions 560 from the central waveguide region 556'. 564 represents the intensity distribution of a fundamental optical mode propagating along the central waveguide portion 556'. The outer wings of the fundamental mode 564 do not extend significantly into the absorbing regions 562, if at all. The next higher optical mode is illustrated having a second intensity profile 566. The outer wings of the second mode 556 extend further into the absorbing regions than the wings of the fundamental mode 564, and so the second mode 556 experiences higher losses than the fundamental mode 564. The absorbing regions 562 may have a higher refractive index than the cladding regions 560, thus encouraging light within the cladding regions 560 to pass into the absorbing regions 562 to be absorbed, further discriminating against higher order modes. Thus, this structure may favor the propagation of a single mode at the expense of higher order modes, and so may effectively operate as a mode filter.

Further, the absorbing regions 562 may prevent oscillation between the faces of the substrate, for example faces 502 and 504 of the element 500 in FIG. 5A.

It will be appreciated this waveguiding structure 551 may extend over the whole length, or only a portion of the waveguide 506.

An advantage of the gain element illustrated in FIGS. 5A and 5B is that a diffraction-limited output may be obtained from the second face 504 at a power level considerably higher than is possible if only a single mode waveguide is present throughout the length of the gain element. Another advantage is that the waveguide 506 may act as a mode filter to ensure that only light from a single mode diffracts into the flared light amplifying region 508.

Figure 6A:
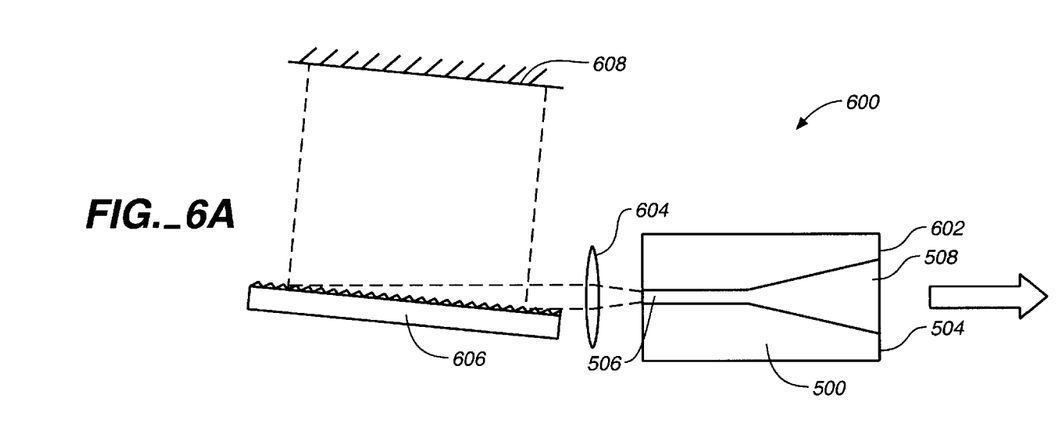
FIGS. 6A and 6B illustrate different embodiments of a tunable, external cavity laser incorporating the gain element of FIG. 5A
Figure 6B:
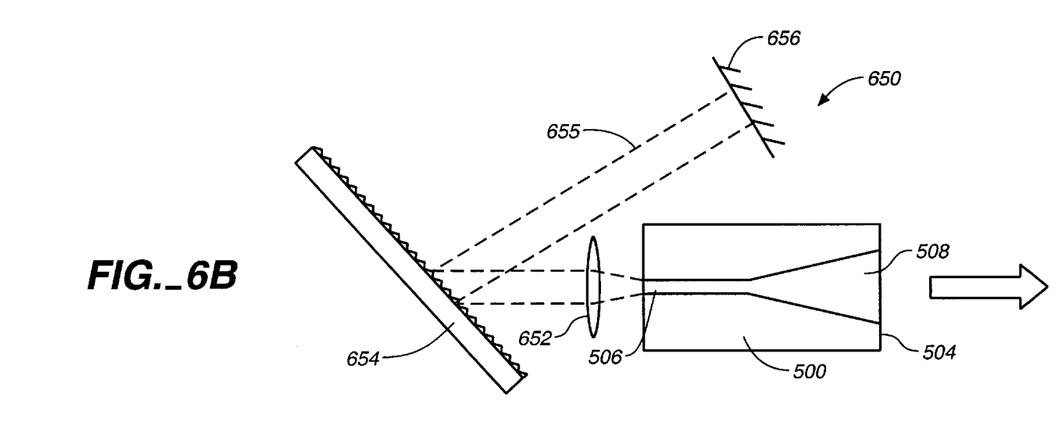

The gain element illustrated in FIGS. 5A and 5B may be employed in an external cavity laser, such as illustrated in FIGS. 6A and 6B. It will be appreciated that the flared amplifier gain element 500 may be employed in any of the external cavity configurations described in U.S. Pat. No. 5,537,432 and U.S. patent application Ser. No. 08/592,906, U.S. Pat. No. 5,771,252. The embodiment illustrated in FIG. 6A is a grazing incidence cavity similar to the cavity illustrated in FIG. 2. However, in this embodiment, the output is taken from the second face 504 of the gain element 500. The second face 504 of the gain element 500 is provided with a low-reflectivity coating 602. The low-reflectivity coating 602 (typically less than 1%) provides sufficient feedback to maintain the laser above threshold while producing a high-power output from the flared amplifier section 508. The external cavity laser 600 includes coupling optics 604 to couple light diverging out of the waveguide 506 by collimating the light onto the grazing incidence grating 606. A retroreflector 608 retroreflects light diffracted by the grazing incidence grating 606. It will be appreciated that the zero-order diffraction from the grating 606 may also be used as an output. However, due to the high gain of the flared amplifier section 508, the power level at the frequency selective reflector (the frequency selective reflector in this case including the coupling optics 604, the grazing incidence grating 606, and the retroreflector 608) may only be of the order of a few mW, while the total output power from the laser cavity 600 may be of the order of one or more Watts.

Another embodiment of a laser cavity employing the gain element 500 is illustrated in FIG. 6B. Here the laser cavity 650 may be described as being a hybrid-Littrow cavity. Coupling optics 652 couple the light from the waveguide 506 to a diffraction grating 654 set close to the Littrow angle. The diffracted light 655 is directed to a retroreflector 656, which retroreflects the diffracted light 616. An advantage of this embodiment is that a prism may be used as the retroreflector 656, oriented to invert in the non-dispersive plane. This cavity configuration provides for increased mechanical stability over the conventional Littrow cavity.

Figure 7:
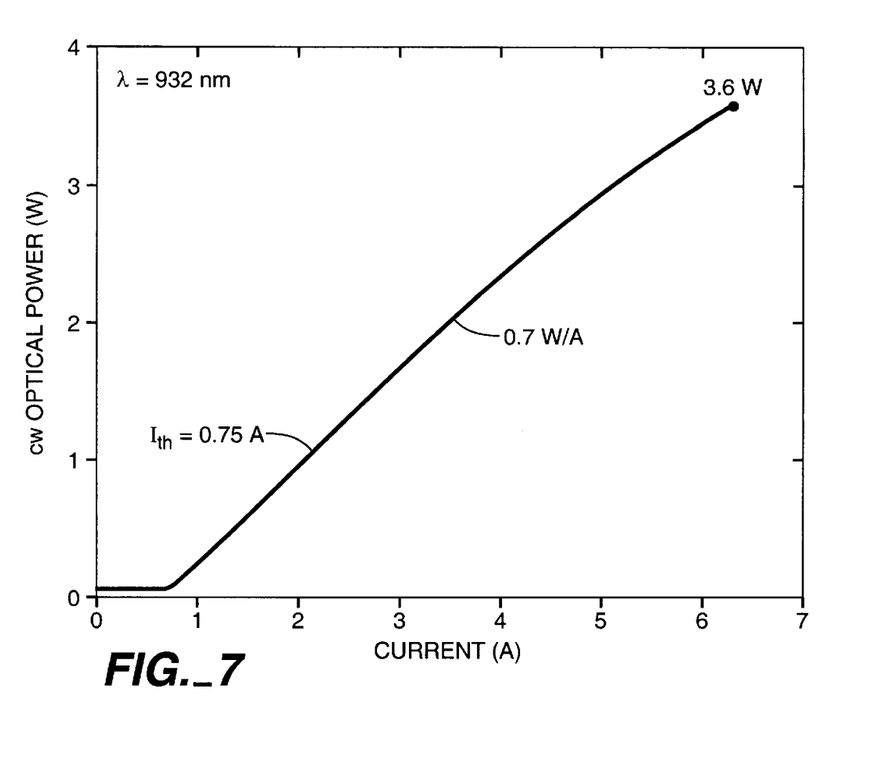
FIG. 7 illustrates a power/current characteristic for the laser of FIG. 6.
Figure 8:
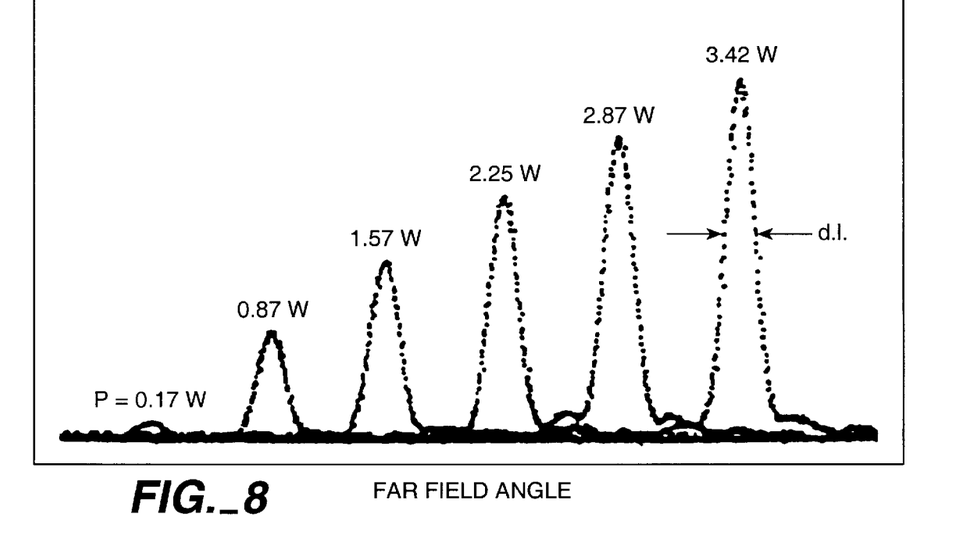
FIG. 8 illustrates beam profiles for various power levels of the laser in FIG. 6.

FIGS. 7 and 8 illustrate some performance characteristics of a tunable, external cavity laser employing a gain element 500 in a Littrow-style cavity. FIG. 7 illustrates output power plotted against current. The gain element had an InGaAs active region and the laser operated at a wavelength of 932 nm. The maximum output power was 3.6 W, which was achieved with a drive current of approximately 6.3 A. The threshold current was 0.75 A and the slope efficiency was 0.7 W/A.

FIG. 8 illustrates the intensity profile of the output beam measured in the far field for increasing output power levels. The output remained diffraction limited out to at least 3.42 W. Thus, this laser produced a tunable output at 3.42 W which was diffraction limited.

Figure 9:
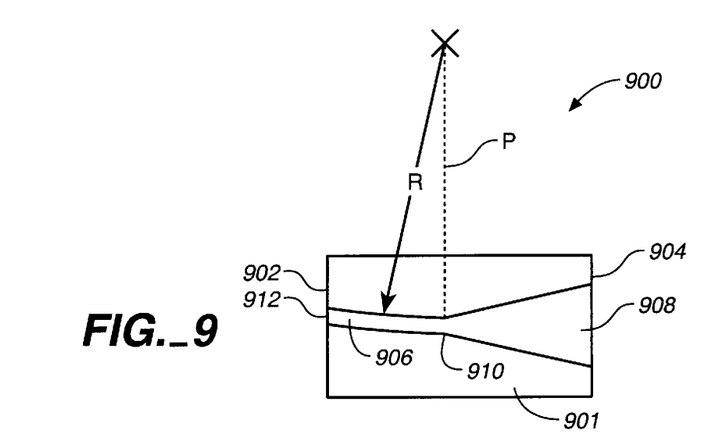
FIG. 9 illustrates an embodiment of a gain element having a curved waveguide and a flared light amplifying region.

Another embodiment of a semiconductor gain element using a flared light amplifying region is illustrated in FIG. 9. The element 900 is constructed on a layered structure 901 having first and second faces 902 and 904, respectively. A flared light amplifying region, having a wide end at the second face 904 is coupled to a waveguide 906 at a narrow end 910. The waveguide 906 includes a curved section so that its output 912 is forms an incident angle with the first face 902 that is greater than 0°. The waveguide 906 may be a single mode waveguide similar to that illustrated in FIG. 5B and may have cladding regions and absorbing regions disposed thereabout. The waveguide 906 may curve continuously from the narrow end 910 of the flared light amplifying region 908 to the first face, as illustrated. In such a case, the center of curvature of the waveguide 906 lies on a plane P that passes through the narrow end 910 of the tapered amplifier region 908. In another embodiment, not illustrated, the plane P may be shifted towards the first face 902 so that the waveguide includes a straight portion coupled directly to the flared light amplifying region 908 and a curved portion that is proximate the first face 902.

It will be appreciated that, since the waveguide 906 does not stretch over the whole length of the layered structure 901, the radius of curvature required to produce a specific angle relative to the first face 902 is less than is required where the waveguide 906 does stretch throughout the length of the layered structure 901. The waveguide 906 may form an angle of incidence, $\theta$, relative to the first face 902 less than 15°. A range of $1°<\theta<10°$ may be used.

It will also be appreciated that the flared amplifier, curved waveguide gain element 900 may be used in an externally tunable laser cavity in a manner similar to the flared amplifier, straight waveguide gain element 500 and the curved waveguide gain element 100. The flared amplifier, curved waveguide gain element 900 is shown in a tunable, external cavity configuration in FIG. 10.

Figure 10:
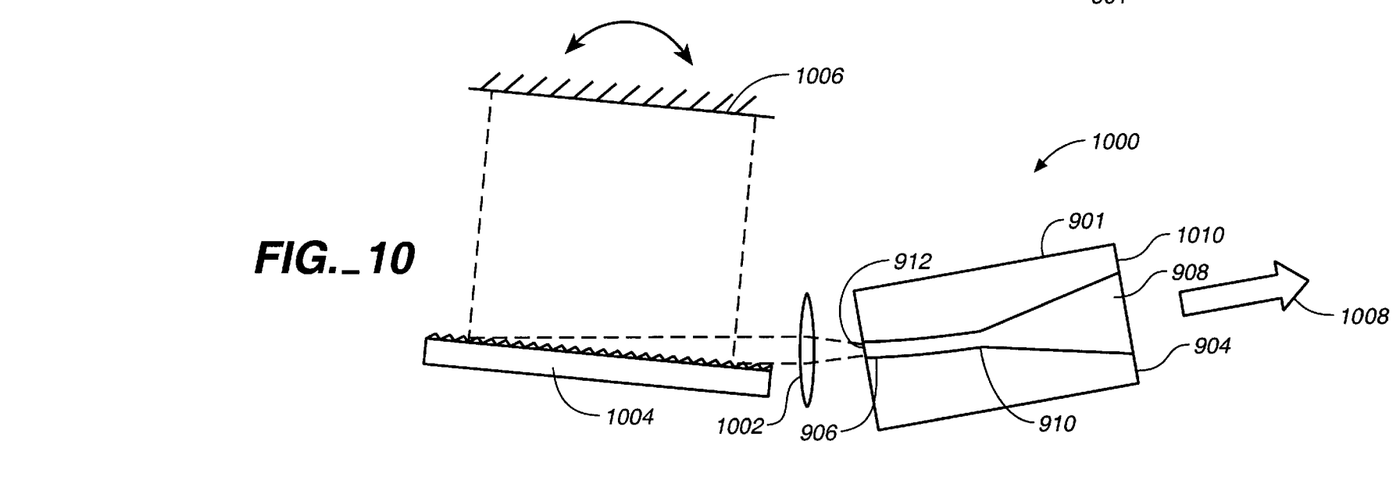
FIG. 10 illustrates an embodiment of a tunable, external cavity laser incorporating the gain element of FIG. 9.

The externally tunable laser cavity 1000 illustrated in FIG. 10 includes the gain element 900 illustrated in FIG. 9, coupling optics 1002, a grazing incidence grating 1004, and a retroreflector 1006. As with the system illustrated in FIG. 6, the second face 904 of the gain element 900 may be provided with a coating 1010 having a preselected reflectivity, typically less than 10%, and, depending on the amount of gain provided by the gain element 900, less than, or around 1%. A high-power, single spatial and longitudinal mode output 1008 is received through the reflective coating 1010. Another low power output (not illustrated) may be obtained as the zero-order diffraction of the diffraction grating 1004. The laser may be tuned by rotation of the retroreflector 1006 in the directions illustrated by the arrows, or by pivoting about a point as in the Littman-Metcalf cavity.

Figure 11:
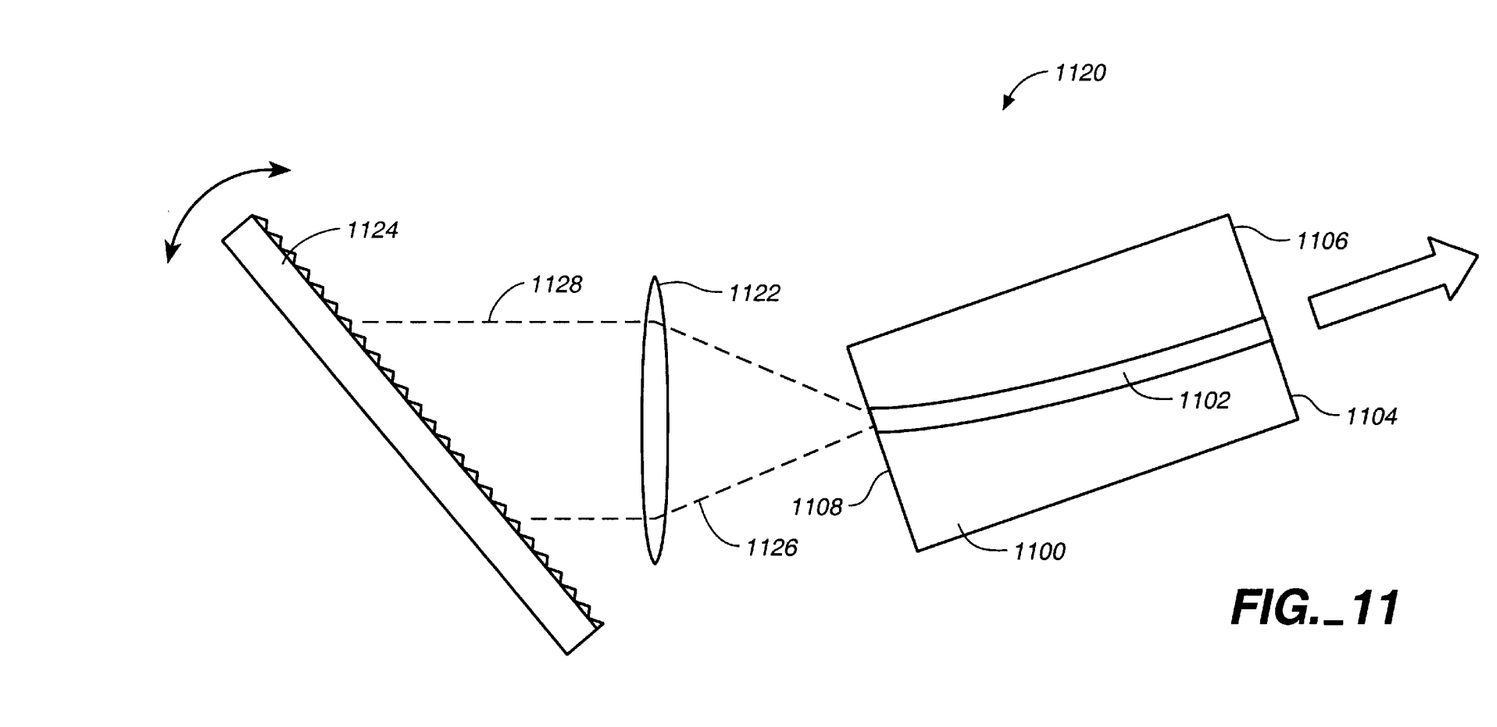
FIG. 11 illustrates an embodiment of a Littrow-type laser cavity incorporating the gain element of FIG. 1.

Another tunable, external cavity configuration using a curved waveguide gain element 1100 is illustrated in FIG. 11. In this configuration, the laser 1120 includes a curved waveguide gain element 1100, coupling optics 1122 and a Littrow-mounted grating 1124. The coupling optics 1122 collimate the light 1126 that diffracts out of the curved waveguide 1102 from the face 1108 and the collimated light 1128 is incident on the grating 1124. Frequency selection takes place because the Littrow grating 1124 retrodiffracts at a specific wavelength that is tunable depending on the angle of incidence on the grating 1124. The laser 1120 may be tuned by rotating the grating 1124 in the direction of the arrows as shown.

In this embodiment, the curved waveguide gain element 1100 is provided with a reflective coating 1106 on the output face 1104. Unlike the laser configuration 200 illustrated in FIG. 2, the coating 1106 is not a highly reflective coating, but has a value, typically in the range 0.5% to 10%, selected to optimize the output power from the laser 1120, depending on the gain of the gain element 1100.

Figure 12A:
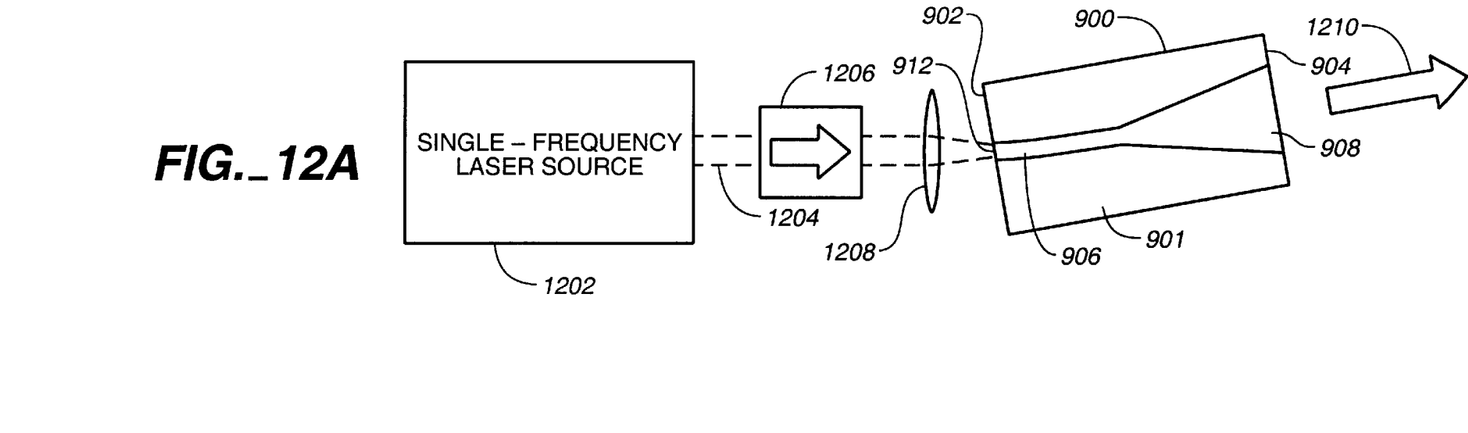
FIGS. 12A and 12B illustrate oscillator/amplifier combinations utilizing the gain elements of FIGS. 9 and 5 respectively as the amplifier.
Figure 12B:
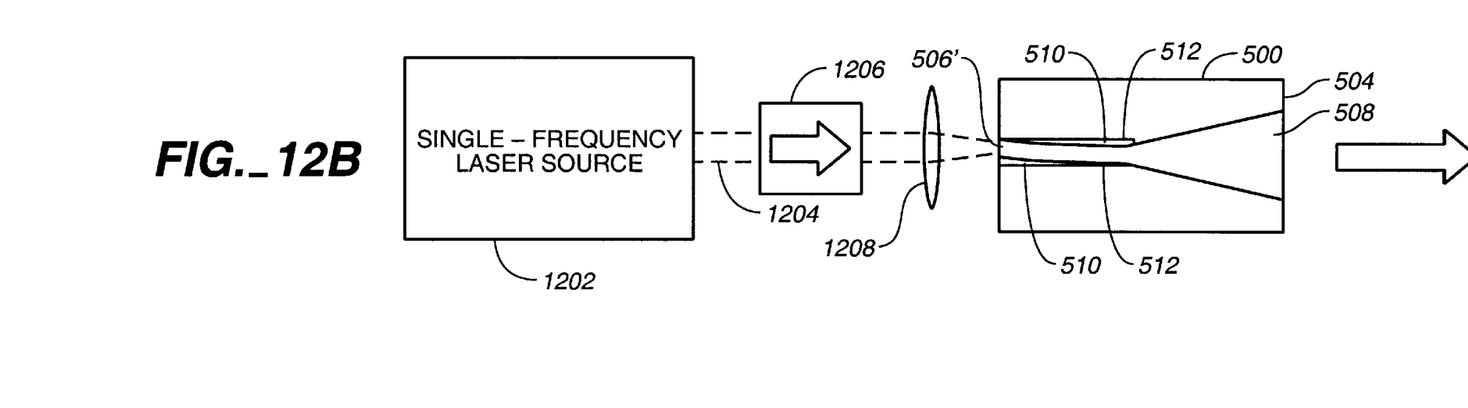

In addition to being used in laser oscillators, the gain elements described herein, especially the gain elements that include a flared light amplifying region, may also be used in an oscillator/amplifier configuration, as illustrated in FIGS. 12A and 12B. FIG. 12 illustrates an oscillator/amplifier 1200 that includes a laser source 1202 that generates a single frequency, high quality output 1204. The laser source 1202 may be any type of laser source that generates an injection signal suitable for amplification in the gain element 900, for example a semiconductor laser, a dye laser or a solid state laser. The output 1204 may be fed through an optical isolator 1206 to prevent reflections being transmitted back into the laser 1202. Coupling optics 1208 are provided to couple the output beam 1204 into the gain element 900. The output beam 1204 is coupled into the waveguide 906. The beam passes along the waveguide 906 and propagates through the flared light amplifying region 908. Since the curved waveguide 906 has an input 912 that is at an angle on the face 902 at greater than 0°, the light beam is focused onto the input face 902 at a non-normal angle of incidence, thus reducing reflections from the gain element 900 directed towards the laser source 1202. Moreover, the input face 902 may be provided with an anti-reflection coating to further reduce reflections.

In conventional semiconductor amplifiers where the waveguide is normally incident on the input face, it has been found that the amplification may vary with the frequency of the signal. This variation in amplification occurs because reflection from the amplifier's end faces causes the signal to make multiple passes through the amplifier. The signal is amplified more when its frequency coincides with a Fabry-Perot resonance frequency of the amplifier as compared to when the signal is between Fabry-Perot resonance frequencies. These resonance frequencies may shift when the amplifier temperature and/or current is varied, resulting in undesirable changes in amplifier output power. This "multiple-pass" effect is suppressed in the present invention because the combination of non-normal incidence and anti-reflection coating produces a very low effective reflectivity at the input face 902. Thus, unlike prior art systems, the oscillator/amplifier of the present invention produces an output whose amplitude is substantially free of the amplifier "multiple-pass" modulation.

The curved waveguide 906 may also act as a mode filter, to remove all modes other than the fundamental spatial mode of the beam 1204. The output 1210 from the gain element 900 has high power, and advantageously is diffraction limited. Thus, the oscillator/amplifier system 1200 produces a high quality, high power, single frequency output.

It will be appreciated that, rather than configuring the laser with the gain element oriented at an angle to the laser cavity as shown in FIG. 12A, the gain element 900 may also be operated with its output oriented parallel to light entering the coupling optics 1208, and with the coupling optics 1208 translated laterally to operate slightly off-axis. In this configuration, the coupling optics 1208 "bend" the light, so that the light passing between the coupling optics 1208 and the waveguide 906 is angled so as to be incident on the waveguide aperture 912 at an angle corresponding to the angle of the waveguide on the end face 902 for maximum coupling.

In the embodiment illustrated in FIG. 12B, the gain element 500 of FIG. 5A is used to amplify the output 1204 from the laser source 1202.

Another embodiment of an oscillator/amplifier combination is illustrated in FIG. 13. Here, the single frequency laser source is the laser 200 as illustrated in FIG. 2, employing a curved waveguide gain element 100. The coupling optics 1302 couple the output 208 from the laser 200 into the curved waveguide 906 of the gain element 900. The coupling optics 1302 may also include an optical isolator (not illustrated) to reduce the reflection of light from the coupling optics 1302 and the gain element 900 back into the laser 200 and to reduce coupling of emission from gain element 900 to gain element 100. Such a laser system advantageously provides a high power, continuously tunable single frequency output that is diffraction limited.

While various examples were provided above, the present invention is not limited to the specifics of the examples. For example, it will be appreciated that all of the different gain elements discussed herein may be used with external cavity lasers, and that they may also be used as external amplifying elements. Additionally, it will be appreciated that the invention is not constrained by the type of semiconductor employed in the optically active element, and is therefore suitable for operation at many different wavelengths, corresponding to different semiconductor alloys.

As noted above, the present invention is applicable to semiconductor gain elements. While having use in many different applications, it is believed to be useful in tunable, external cavity laser systems, particularly in single-mode, continuously tunable laser systems. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A semiconductor gain element, comprising:

a semiconductor layered structure having first and second end faces;

a single-mode filter portion extending along the semiconductor layered structure from the first end face and having a waveguide refractive index;

cladding regions laterally positioned on either side of the single-mode filter portion, each cladding region having a cladding refractive index lower than the waveguide index, so as to optically confine light within the waveguide; and absorbing regions laterally positioned on opposite sides of the cladding regions from the single-mode filter portion that absorb light having a wavelength of light substantially similar to a wavelength of light propagating in a fundamental mode of the single-mode filter portion.

2. A semiconductor gain element as recited in claim 1, further comprising a flared light amplifying region having a wide end at the second end face, extending along the semiconductor layered structure and coupled at a narrow end to the single-mode filter portion.

3. A semiconductor gain element as recited in claim 1, wherein the single mode filter portion includes a straight portion coupled to the flared light amplifying region.

4. A semiconductor gain element as recited in claim 1, wherein the single-mode filter portion includes a curved portion having a radius of curvature in the range from 1 mm and 40 mm proximate the first end face of the semiconductor layered structure so that the single-mode filter portion is incident on the first end face at an angle, $\theta$, greater than $0°$.

5. A semiconductor gain element as recited in claims 2, wherein the cladding regions are regions including at least one of the group consisting of a selective area growth region, an etch-and-regrowth region, a laser-assisted disordering region, an impurity-induced disordering region, a vacancy-induced disordering region and a reverse-biased region.

6. A semiconductor gain element as recited in claim 1, wherein the absorbing regions have an absorbing region refractive index greater than the cladding refractive index.

7. A semiconductor gain element as recited in claim 1, wherein the absorbing regions absorb light propagating within the single-mode filter portion and having a mode structure higher than the fundamental mode.

8. A semiconductor gain element as recited in claim 1, wherein the single-mode filter portion is an active region providing gain at the wavelength of light propagating in the fundamental mode.

9. A semiconductor gain element as recited in claim 8, further comprising a flared light amplifying region having a wide end at the second end face and coupled at a narrow end to the single-mode filter portion.

\* \* \* \* \*